(12) United States Patent
Kuroda et al.

(10) Patent No.: US 7,813,259 B2
(45) Date of Patent: Oct. 12, 2010

(54) ELECTRONIC CIRCUIT

(75) Inventors: Tadahiro Kuroda, Yokohama (JP);
Daisuke Mizoguchi, Yokohama (JP);
Noriyuki Miura, Yokohama (JP)

(73) Assignee: Keio University, Tokyo (JP)

( * ) Notice: Subject to any disclaimer, the term of this patent is extended or adjusted under 35 U.S.C. 154(b) by 332 days.

(21) Appl. No.: 11/660,450

(22) PCT Filed: Aug. 17, 2005

(86) PCT No.: PCT/JP2005/014990
§ 371 (c)(1),
(2), (4) Date: Jul. 16, 2007

(87) PCT Pub. No.: WO2006/022172
PCT Pub. Date: Mar. 2, 2006

(65) Prior Publication Data
US 2007/0274198 A1    Nov. 29, 2007

(30) Foreign Application Priority Data
Aug. 24, 2004 (JP) ............................. 2004-244060

(51) Int. Cl.
*H04J 1/12* (2006.01)
(52) U.S. Cl. ....................................... 370/201; 257/777
(58) Field of Classification Search ................. 370/201; 257/777; 336/200; 174/113 R; 333/1
See application file for complete search history.

(56) References Cited
U.S. PATENT DOCUMENTS
5,701,037 A * 12/1997 Weber et al. ................. 257/777

(Continued)

FOREIGN PATENT DOCUMENTS
JP        01-187666        7/1989

(Continued)

OTHER PUBLICATIONS

Ohguro et al; "Ultra-thin chip with permalloy film for high performance MS/FR CMOS;" 2004 Symposium on VLSI Tech. Digest of Technical Papers (Jun. 2004) pp. 220-221 (cited in ISR).

(Continued)

*Primary Examiner*—Albert T Chou
(74) *Attorney, Agent, or Firm*—Edwards Angell Palmer & Dodge LLP

(57) ABSTRACT

An electronic circuit capable of reducing crosstalk to such a degree that the crosstalk can be substantially disregarded even where a plurality of communications channels are juxtaposed in close proximity to each other when achieving communications between substrates by inductive coupling. The transmitter coils 11 are placed on a lower chip and the receiver coils 12 are placed on an upper chip, and where it is assumed that the distance between the chips is X, and the distance between the communications channels is Y (that is, the horizontal distance between the coil centers), there exists a position, where the magnetic flux density in the receiver coils 12 resulting from the transmitter coils 11 becomes zero (0), at a predetermined Yo. That is, because large crosstalk occurs when Y is small, and small crosstalk of an inverted symbol occurs when Y is large, in the meantime, there will exist a position, where the value obtained by integrating the magnetic flux density B in the receiver coils 12 becomes zero (0), without fail. No crosstalk is theoretically generated at the position.

4 Claims, 7 Drawing Sheets

U.S. PATENT DOCUMENTS

| | | | | |
|---|---|---|---|---|
| 6,486,405 | B2 * | 11/2002 | Lin | 174/113 R |
| 7,102,455 | B2 * | 9/2006 | Lin et al. | 333/1 |

FOREIGN PATENT DOCUMENTS

| | | |
|---|---|---|
| JP | 2005-228981 | 8/2005 |

OTHER PUBLICATIONS

Miura et al; "Cross Talk Countermeasures in Inductive Inter-chip Wireless Superconnect;" 2004 Custom Integrated Circuits Conference (Oct. 2004) pp. 99-102 (Cited in ISR).

Mizoguchi et al; "A 1.2Gb/s/pin Wireless Superconnect based on Inductive Inter-chip Signaling (IIS);" 2004 IEEE International Solid-State Circuits Conferences (Feb. 2004); pp. 142-143.

Miura et al; "Analysis and Design of Transceiver Circuit and Inductor Layout for Inductive Inter-chip Wireless Superconnect;" 2004 Symposium on VLSI Circuits Digest of Technical Papers (Jun. 2004) pp. 246-249.

International Search Report dated Dec. 6, 2005.

* cited by examiner

F I G. 2
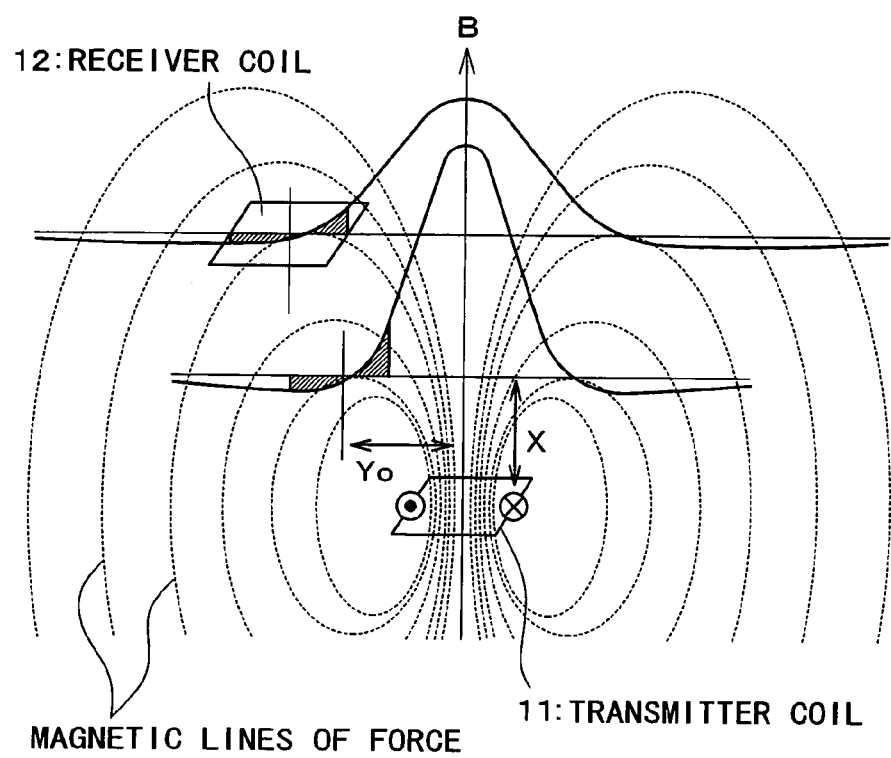

ELECTRONIC CIRCUIT

BACKGROUND OF THE INVENTION

1. Field of the Invention

The present invention relates to an electronic circuit that is capable of suitably carrying out communications between substrates such as IC (Integrated Circuit) bare chips, and PCBs (Printed Circuit Boards).

2. Description of the Related Art

The present inventors have proposed realizing a system in package (SiP) that is capable of sealing a plurality of bare chips in one LSI package (Large Scale Integration) by utilizing a method for three-dimensionally mounting chips and electrically connecting between chips by means of inductive coupling (Patent Document 1).

FIG. 7 is a view depicting a configuration of an electronic circuit according to the invention of prior art Japanese application. The electronic circuit is composed of the first through the third LSI chips 31a, 32b and 31c, which is an example in which LSI chips are stacked up in three layers and a bus is formed so as to lie across the three chips. That is, it composes a single communications channel capable of carrying out communications between the three (between three LSI chips). The first through the third LSI chips 31a, 31b and 31c are vertically stacked up, and the respective chips are fixed to each other with an adhesive agent. The first through the third transmitter coils 33a, 33b and 33c, which are respectively used for transmission, are formed by wiring on the first through the third LSI chips 31a, 31b and 31c, and also the first through the third receiver coils 35a, 35b and 35c, which are respectively used for receiving, are formed by wiring thereon. These coils are disposed on the first through the third LSI chips 31a, 31b and 31c so that the centers of the openings of the three pairs of transmitter and receiver coils 33 and 35 are made coincident with each other. Accordingly, each of the three pairs of transmitter and receiver coils 33 and 35 form an inductive coupling, which is followed by a composition of a single communications channel. The first through the third transmitter circuits 32a, 32b and 32c are connected to the first through the third transmitter coils 33a, 33b and 33c respectively, and the first through the third receiver circuits 34a, 34b and 34c are connected to the first through the third receiver coils 35a, 35b and 35c respectively. The transmitter and receiver coils 33 and 35 are three-dimensionally mounted as coils having one or more turns in an area permitted for communications, utilizing a multilayer wiring of a process technology. A profile best suitable for communications exists in the transmitter and receiver coils 33 and 35, and it is necessary that they have an optimal number of times of winding, optimal opening and optimal line width. Generally, the transmitter coils 33 are smaller than the receiver coils 35.

[Patent Document 1] Japanese Patent Application No. 2004-037242

SUMMARY OF THE INVENTION

Herein, crosstalk will be brought about, resulting from leakage of magnetic lines of force between proximal communications channels if communications channels composed of more than one pairs of transmitter and receiver coils are juxtaposed in close proximity to each other in a plurality in order to increase the communications capacity between chips.

In view of the above-described situations, it is an object of the invention to provide an electronic circuit capable of reducing the occurrence of crosstalk to such a degree that the crosstalk can be substantially disregarded even if a plurality of communications channels are juxtaposed in close proximity to each other where communications between substrates are achieved by inductive coupling.

An electronic circuit according to the invention includes a first substrate including a plurality of transmitter coils formed by wiring on the substrate; and a second substrate including a plurality of receiver coils that are respectively formed at positions corresponding to the first coils by wiring on the substrate and thus compose communications channels by being inductively coupled to the first coils, wherein the transmitter coils and the receiver coils of respective communications channels are disposed at positions where positive and negative crosstalk from proximal communications channels depending on the distance are counterbalanced.

Further, because the electronic circuit includes three or more substrates, wherein the distance between the first substrate and the second substrate thereof being longest, the crosstalk can be decreased in communications in which generally crosstalk is made problematic.

Also, because communications channels nearest to each other operate in different phases, and communications channels next nearest to each other operate in the same phase and are disposed at the positions where crosstalk can be counterbalanced, the crosstalk can be decreased even in a case where a number of communications channels are provided.

According to the invention, it is possible to reduce crosstalk to such a degree that occurrence of crosstalk can be disregarded even in a case where a plurality of communications channels are juxtaposed in close proximity to each other where communications between substrates are achieved by means of inductive coupling.

The present specification includes the contents described in the specification and/or the drawings of Japanese Patent Application No. 2004-244060 that is the basis of priority of the present application.

BRIEF DESCRIPTION OF THE DRAWINGS

FIG. 2 is a view depicting magnetic lines of force generated in the first exemplary Embodiment;

DESCRIPTION OF REFERENCE SYMBOLS

Figure 1:
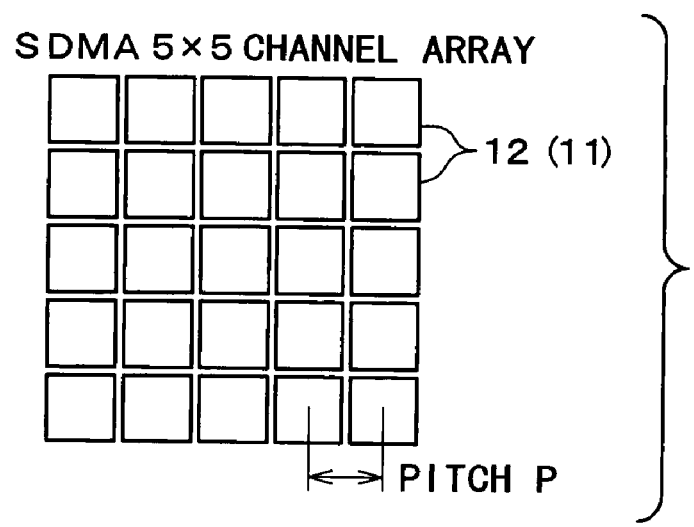
FIG. 1 is a view depicting the state, when being observed from above of a chip, where a plurality of communications channels in an electronic circuit according to a first exemplary Embodiment of the invention are juxtaposed.

11 Transmitter coil
12 Receiver coil
21 Flip-flop circuit
22 Transmitter circuit 23 Transmitter coil
24 Capacitor
25 Receiver coil
26 Receiver circuit
31 LSI chip
32 Transmitter circuit
33 Transmitter coil
34 Receiver circuit
35 Receiver coil
Rxdata Receiving data
Txdata Transmission data

DETAILED DESCRIPTION OF EXEMPLARY EMBODIMENTS

Hereinafter, a detailed description is given of a best mode by which the invention is embodied, with reference to the accompanying drawings.

FIG. 1 is a view depicting the state, when being observed from above of a chip, where a plurality of communications channels in an electronic circuit according to the first exemplary Embodiment of the invention are juxtaposed. In the first exemplary Embodiment, square transmitter coils 11 are provided on one chip and square receiver coils 12 are provided on the other chip, and communications channels composed thereof are juxtaposed by 5×5=25 channels at an interval of pitch P. This is made into SDMA (Space Division Multiple Access).

FIG. 2 is a view depicting magnetic lines of force generated in the first exemplary Embodiment. In further detail, FIG. 2 depicts magnetic lines of force based on the transmitter coils 11 where the transmitter coils 11 are placed on a lower chip and the receiver coils 12 are placed on an upper chip and where it is assumed that the distance between the chips is X, and a magnetic flux density B on the chip having the receiver coils 12 placed thereon in cases where X is large and small. Where the distance between communications channels (that is, the horizontal distance between the coil centers) is assumed to be Y (that is, Y=P), there exists a position, where the magnetic flux density in the receiver coils 12 resulting from the transmitter coils 11 becomes zero (0), at a predetermined Yo. As illustrated, when Y is small, large crosstalk occurs, and when Y is large, small crosstalk of an inverted symbol occurs. Therefore, in the meantime, there exists a position, where the value obtained by integrating the magnetic flux density B in the receiver coils 12 becomes zero (0), without fail. No crosstalk is theoretically generated at the position.

Figure 3:
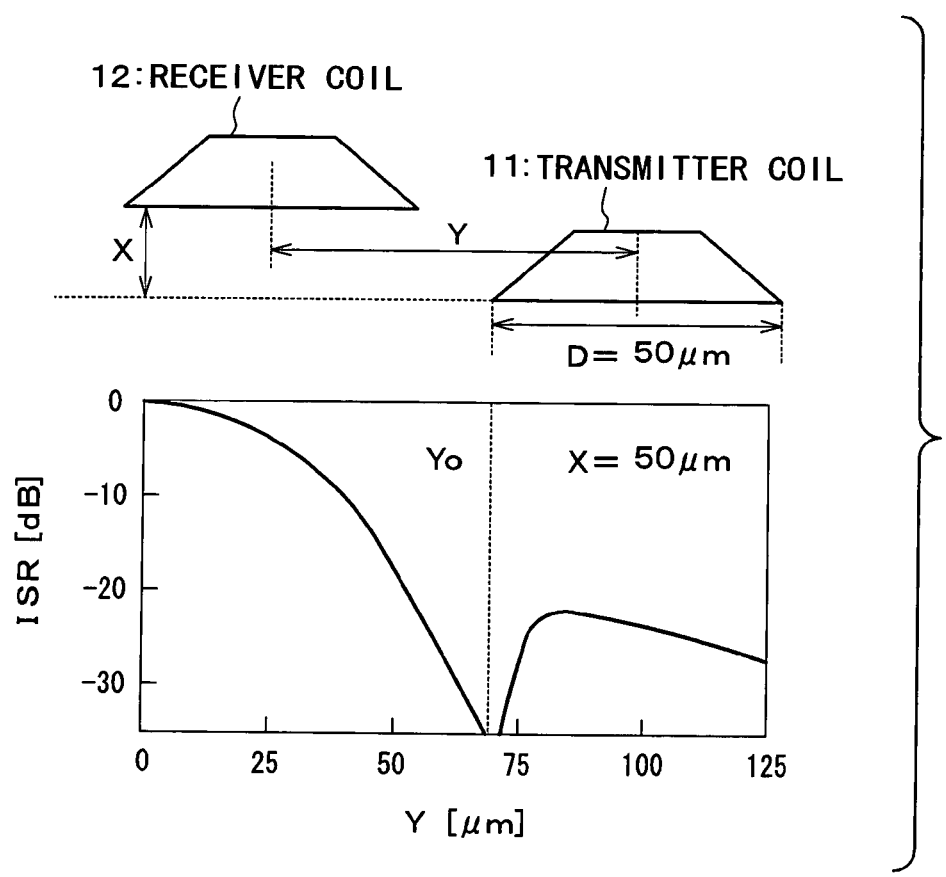
FIG. 3 is a view depicting the ISR (Interference-to-Signal Ratio) corresponding to the distance between communications channels according to the first exemplary Embodiment.

FIG. 3 is a view depicting the ISR (Interference-to-Signal Ratio) corresponding to the distance between communications channels according to the first exemplary Embodiment. The conditions thereof are the same as those of FIG. 2. The drawing depicts the ISR [dB] (Interference-to-Signal Ratio) for the distance Y [mm] between channels where it is assumed that the length D of one side of the square transmitter coils 11 and receiver coils 12 is equal to 50 [mm] and the distance X between chips is equal to 50 [mm]. In this case, the crosstalk is minimized at Yo≅70 [mm].

Figure 4:
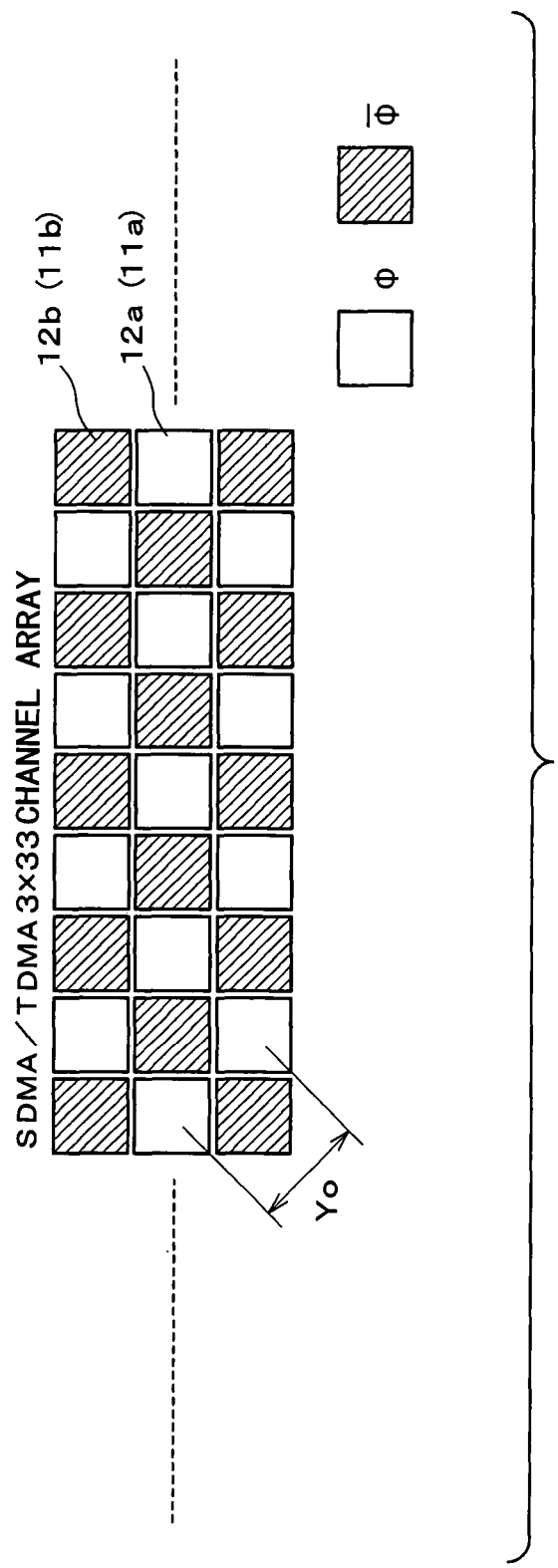
FIG. 4 is a view depicting the state, when being observed from above of a chip, where a plurality of communications channels in an electronic circuit according to a second exemplary Embodiment of the invention are juxtaposed.

FIG. 4 is a view depicting the state, when being observed from above of a chip, where a plurality of communications channels in an electronic circuit according to the second exemplary Embodiment of the invention are juxtaposed. The second exemplary Embodiment is such that the communications channels are divided into two groups, and the respective groups are operated in phases different from each other. Transmitter coils 11a and receiver coils 12a of the group in which the coils are operated in the earlier phase and transmitter coils 11b and receiver coils 12b of the group in which the coils are operated in the later phase are provided. And, the distance between the communications channels adjacent to each other in the same group is assumed to be Yo, and the communications channels of the respective groups are disposed in a checker pattern (that is, the communications channels of the other group are disposed before and after the communications channel of one group and at the right side and the left side thereof), wherein 99 channels (3×33) are juxtaposed as an entirety. This is concurrently used for the SDMA (Space Division Multiple Access) and TDMA (Time Division Multiple Access).

Figure 5:
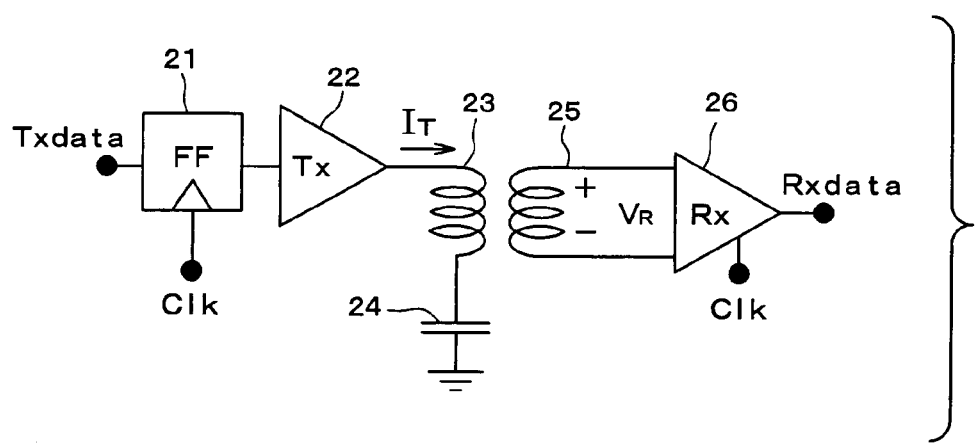
FIG. 5 is a view depicting the configuration of an electronic circuit according to the second exemplary Embodiment.

FIG. 5 is a view depicting the configuration of an electronic circuit according to the second exemplary Embodiment. FIG. 5 depicts one communications channel composed of a pair of transmitter coil 23 and receiver coil 25. An electronic circuit according to the second exemplary Embodiment is composed of a flip-flop circuit 21, a transmitter circuit 22, a transmitter coil 23, a capacitor 24, a receiver coil 25, and a receiver circuit 26. In the second exemplary Embodiment, the communications channels of the groups operating in different phases as in the adjacent communications channels as shown in FIG. 4 are disposed; and the phase control thereof is carried out by clock Clk.

Figure 6:
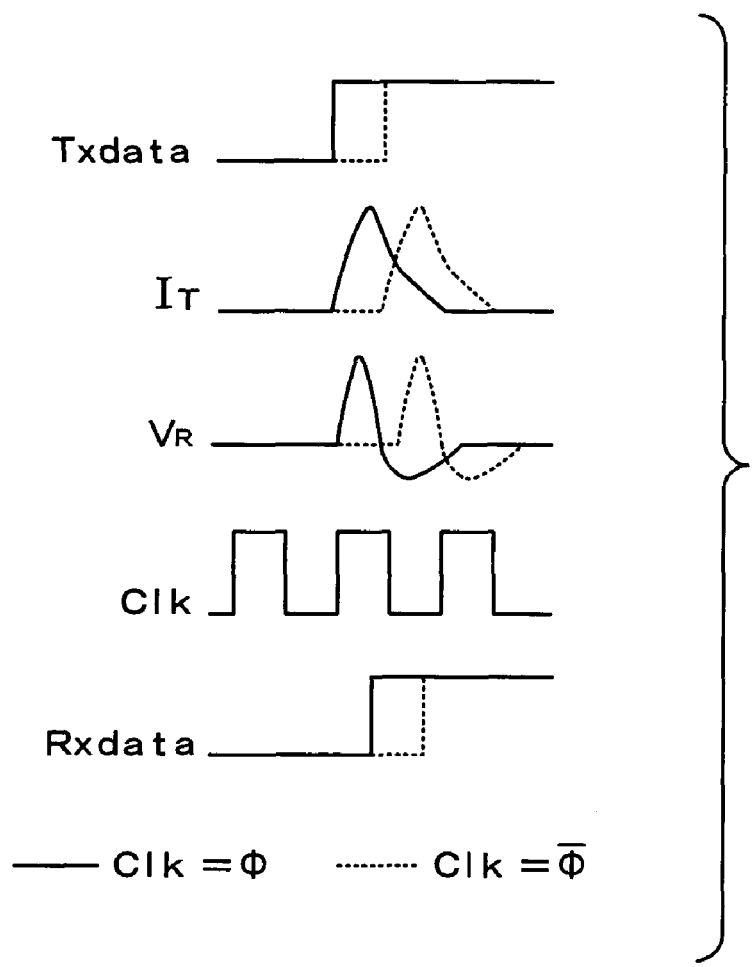
FIG. 6 is a waveform diagram of respective parts describing the actions of an electronic circuit according to the second exemplary Embodiment.
Figure 7:
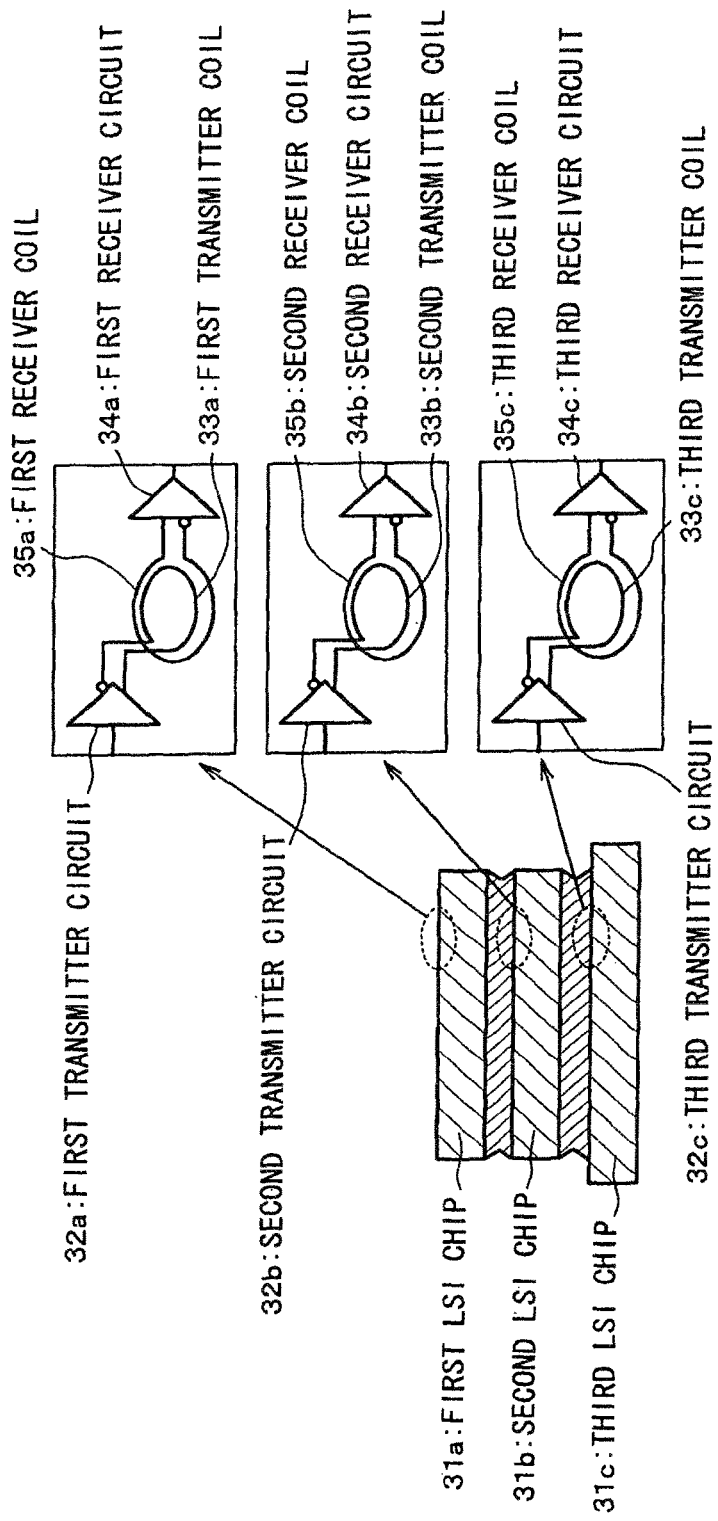
FIG. 7 is a view depicting the configuration of an electronic circuit according to a prior art Japanese application.

FIG. 6 is a waveform diagram of respective parts describing the actions of an electronic circuit according to the second exemplary embodiment 2. As inputted transmission data Txdata are turned from low to high, the flip-flop circuit 21 drives the transmission circuit 22 at the time of clock Clk, and the transmission circuit 22 flows a triangular wave-formed charging current IT, which charges the capacitor 24 via the transmission coil 23, to the transmission coil 23. Thus, voltage VR based on induction current is generated in the receiver coil 25 while the receiver circuit 26 detects a signal at the time of clock Clk and obtains receiving data Rxdata.

The second exemplary Embodiment shows an electronic circuit that is Operated at two different phases in which the earlier phase Φ and the later phase bar (Φ) are in inverted phase relationship. However, communications channels may be divided into three or more groups and operated in three or more different phases. In the second exemplary Embodiment, the disposition area of the communications channels is made slender and rectangular as a whole. This is suitable as the structure by which crosstalk can be reduced since the number of communications channels existing in the proximity thereof is smaller than in the first exemplary Embodiment.

Further, the present invention is not limited to the above-described embodiments.

Any particular description of the above-described embodiments does not refer to communications between three or more layers. As described in the prior application, it is a matter of course that the invention can be preferably carried out for communications between three or more layers. In the case of communications between substrates of three or more layers, a point in which generally crosstalk particularly becomes problematic resides in communications between the substrates farthest from each other, where signals are minimized. Therefore, it is preferable that the communications channels are disposed at pitch P equal to the distance Yo between communications channels where the crosstalk is minimized for the distance X between the substrates farthest from each other. However, as in a case where communications are required between the substrates with particularly high communications quality in comparison with the other cases, it is not necessary that the crosstalk between the substrates farthest from each other is minimized.

The shape or profile of the transmitter coils and the receiver coils may be optional; that is, circular, elliptical, or polygonal such as triangular, square or hexagonal.

All the publications, patents and patent applications cited in the present specification are taken in the present specification as references.

What is claimed is:

1. An electronic circuit comprising:
    a first substrate including a plurality of transmitter coils formed by wiring on the substrate; and
    a second substrate including a plurality of receiver coils that are respectively formed at positions corresponding to said transmitter coils by wiring on the substrate and thus compose communications channels by being inductively coupled to said transmitter coils,
    wherein each said channel uses only one said transmitter coil and only one said receiver coil, and the transmitter coils and the receiver coils of respective communications channels are disposed at positions laterally displaced from each other by a predetermined non-zero interval such that positive and negative crosstalk from proximal communications channels depending on distance are counterbalanced.

2. The electronic circuit according to claim 1, comprising at least one additional substrate, wherein the distance between said first substrate and said second substrate thereof is greater than the distance between any other pair of said substrates.

3. An electronic circuit comprising:
    a first substrate including a plurality of transmitter coils formed by wiring on the substrate; and
    a second substrate including a plurality of receiver coils that are respectively formed at positions corresponding to said transmitter coils by wiring on the substrate and thus compose communications channels by being inductively coupled to said transmitter coils,
    wherein each said channel uses only one said transmitter coil and only one said receiver coil, and the transmitter coils and the receiver coils of respective communications channels are disposed at positions laterally displaced from each other by a predetermined interval such that positive and negative crosstalk from proximal communications channels depending on distance are counterbalanced, and
    wherein the communications channels nearest to each other operate in different phases; communications channels next nearest to each other operate in the same phase and are disposed at the positions where crosstalk is counterbalanced.

4. An electronic circuit comprising:
    a first substrate including a plurality of transmitter coils formed by wiring on the substrate; and
    a second substrate including a plurality of receiver coils that are respectively formed at positions corresponding to said transmitter coils by wiring on the substrate and thus compose communications channels by being inductively coupled to said transmitter coils,
    wherein each said channel uses only one said transmitter coil and only one said receiver coil, and the transmitter coils and the receiver coils of respective communications channels are disposed at positions laterally displaced from each other by a predetermined interval such that positive and negative crosstalk from proximal communications channels depending on distance are counterbalanced, further comprising three or more substrates, wherein the distance between said first substrate and said second substrate thereof is longest, and
    wherein the communications channel nearest to each other operate in different phases; communications channels next nearest to each other operate in the same phase and are disposed at the positions where crosstalk is counterbalanced.

* * * * *